US007036046B2

(12) United States Patent
Rally et al.

(10) Patent No.: US 7,036,046 B2
(45) Date of Patent: Apr. 25, 2006

(54) PLD DEBUGGING HUB

(75) Inventors: Nicholas James Rally, San Mateo, CA (US); Alan Louis Herrmann, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 654 days.

(21) Appl. No.: 10/295,265

(22) Filed: Nov. 14, 2002

(65) Prior Publication Data
US 2004/0098638 A1   May 20, 2004

(51) Int. Cl.
*G06F 11/00* (2006.01)
(52) U.S. Cl. .......................... 714/39; 714/725
(58) Field of Classification Search ............ 714/39, 714/30, 725, 733, 734; 703/15, 16, 17, 28; 326/38, 39
See application file for complete search history.

(56) References Cited

U.S. PATENT DOCUMENTS

| 4,527,234 A | 7/1985 | Bellay |
| 4,696,004 A | 9/1987 | Nakajima |
| 4,788,492 A | 11/1988 | Schubert |
| 4,835,736 A | 5/1989 | Easterday |
| 4,847,612 A | 7/1989 | Kaplinsky |
| 4,873,459 A | 10/1989 | El Gamo et al. |
| 5,036,473 A | 7/1991 | Butts et al. |
| 5,058,114 A | 10/1991 | Kuboki et al. |
| 5,124,588 A | 6/1992 | Baltus et al. |
| 5,157,781 A | 10/1992 | Harwood et al. |
| 5,329,470 A | 7/1994 | Sample et al. |
| 5,365,165 A | 11/1994 | El-Ayat et al. |
| 5,425,036 A * | 6/1995 | Liu et al. ............ 714/35 |
| 5,452,231 A | 9/1995 | Butts et al. |
| 5,568,437 A | 10/1996 | Jamal |
| 5,572,712 A | 11/1996 | Jamal |
| 5,629,617 A | 5/1997 | Uhling et al. |
| 5,640,542 A | 6/1997 | Whitsel et al. |
| 5,661,662 A | 8/1997 | Butts et al. |

(Continued)

FOREIGN PATENT DOCUMENTS

EP   0 762 279 A1   3/1997

OTHER PUBLICATIONS

Marantz, Joshua, "Enhanced Visibility and Performance on Functional Verification by Reconstruction", Proceedings of the 35th Annual Conference on Design Automation Conference, pp. 164-169. 1998.

(Continued)

*Primary Examiner*—Scott Baderman
(74) *Attorney, Agent, or Firm*—Beyer Weaver & Thomas, LLP

(57) ABSTRACT

User logic within a PLD is debugged by way of the hub. The PLD includes a serial interface (such as a JTAG port) that communicates with a host computer. Any number of client modules are within the PLD and provide instrumentation for the PLD. A module is a logic analyzer, fault injector, system debugger, etc. Each client module has connections with the user logic that allows the instrumentation to work with the user logic. The hub communicates with each client module over a hub/node signal interface and communicates with the serial interface over a user signal interface. The hub routes instructions and data from the host computer to a client module (and vice-versa) via the serial interface and uses a selection identifier to uniquely identify a module. The hub functions as a multiplexor, allowing any number of client modules to communicate externally though the serial interface as if each node were the only node interacting with user logic.

23 Claims, 9 Drawing Sheets

U.S. PATENT DOCUMENTS

| | | | |
|---|---|---|---|
| 5,717,695 | A | 2/1998 | Manela et al. |
| 5,717,699 | A | 2/1998 | Haag et al. |
| 5,764,079 | A | 6/1998 | Patel et al. |
| 5,821,771 | A | 10/1998 | Patel et al. |
| 5,870,410 | A * | 2/1999 | Norman et al. ............... 714/25 |
| 5,960,191 | A | 9/1999 | Sample et al. |
| 5,983,277 | A | 11/1999 | Heile et al. |
| 6,014,334 | A | 1/2000 | Patel et al. |
| 6,016,563 | A | 1/2000 | Fleisher |
| 6,020,758 | A | 2/2000 | Patel et al. |
| 6,104,211 | A * | 8/2000 | Alfke .......................... 326/91 |
| 6,107,821 | A | 8/2000 | Kelem et al. |
| 6,157,210 | A | 12/2000 | Zaveri et al. |
| 6,182,247 | B1 * | 1/2001 | Herrmann et al. ............ 714/39 |
| 6,212,650 | B1 | 4/2001 | Guccione |
| 6,223,148 | B1 | 4/2001 | Stewart et al. |
| 6,247,147 | B1 * | 6/2001 | Beenstra et al. .............. 714/39 |
| 6,259,271 | B1 | 7/2001 | Couts-Martin et al. |
| 6,286,114 | B1 * | 9/2001 | Veenstra et al. .............. 714/39 |
| 6,317,860 | B1 * | 11/2001 | Heile ........................... 716/5 |
| 6,321,369 | B1 * | 11/2001 | Heile et al. ................... 716/11 |
| 6,389,558 | B1 * | 5/2002 | Herrmann et al. ............ 714/39 |
| 6,460,148 | B1 * | 10/2002 | Veenstra et al. .............. 714/39 |
| 6,481,000 | B1 * | 11/2002 | Zaveri et al. ................. 716/17 |
| 6,704,889 | B1 * | 3/2004 | Veenstra et al. .............. 714/39 |
| 6,754,862 | B1 * | 6/2004 | Hoyer et al. ................. 714/725 |
| 6,794,896 | B1 * | 9/2004 | Brebner ....................... 326/38 |
| 6,891,397 | B1 * | 5/2005 | Brebner ....................... 326/41 |
| 2003/0110430 | A1 * | 6/2003 | Bailis et al. ................. 714/725 |
| 2004/0032282 | A1 * | 2/2004 | Lee et al. ..................... 326/39 |

OTHER PUBLICATIONS

Stroud, Charles et al., "Evaluation of FPGA Resources for Built-in-Self-test of Programmable Logic Blocks", Proceedings of the 1996 ACM 4th International Symposium on Field-programmable Gate Arrays, p. 107. 1996.

Collins, Robert R., "Overview of Pentium Probe Mode", (www.x86.org/ariticles/problemd/ProbeMode.htm), Aug. 21, 1998, 3 pgs.

Collins, Robert R., "ICE Mode and the Pentium Processor", (www.x86.org/ddj/Nov97/Nov97.htm), Aug. 21, 1986, 6 Pgs.

"PentiumPro Family Developer's Manual", vol. 1: Specifications, Intel®Corporation, 1996, 9 Pgs.

"Pentium® Processor User's Manual", vol. 1, Intel®Corporation, 1993, Pgs. 3-11.

Xilinx, Inc.; ISE Logic Design Tools: ChipScope.

Praveen K. Jaini and Nur A. Touba; "Observing Test Response of Embedded Cores through Surround Logic"; 1999 IEEE.

Nur A. Touba and Bahram Pouya; "Testing Embedded Cores Using Partial Isolation Rings"; 1997 IEEE.

* cited by examiner

Node Examples

PLD DEBUGGING HUB

This application is related to U.S. patent application Ser. Nos. 10/351,017 and 10/629,508, and to U.S. Pat. Nos. 6,182,247, 6,247,147, 6,286,114, 6,389,558 and 6,460,148 and 6,704,889 and 6,754,862, which are all hereby incorporated by reference.

FIELD OF THE INVENTION

The present invention relates generally to analysis of a hardware device in connection with a computer system. More specifically, the present invention relates to control of multiple debugging tools within a programmable logic device.

BACKGROUND OF THE INVENTION

In the field of electronics various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

In the course of generating a design for a PLD, programming the PLD and checking its functionality on the circuit board or in the system for which it is intended, it is important to be able to debug the PLD because a design is not always perfect the first time. Before a PLD is actually programmed with an electronic design, a simulation and/or timing analysis may be used to debug the electronic design. Once the PLD has been programmed within a working system, however, it is also important to be able to debug the PLD in this real-world environment.

And although a simulation may be used to debug many aspects of a PLD, it is nearly impossible to generate a simulation that will accurately exercise all of the features of the PLD on an actual circuit board operating in a complex system. For example, a simulation may not be able to provide timing characteristics that are similar to those that will actually be experienced by the PLD in a running system; e.g., simulation timing signals may be closer or farther apart than what a PLD will actually experience in a real system.

In addition to the difficulties in generating a comprehensive simulation, circuit board variables such as temperature changes, capacitance, noise, and other factors may cause intermittent failures in a PLD that are only evident when the PLD is operating within a working system. Still further, it can be difficult to generate sufficiently varied test vectors to stress the PLD design to the point where most bugs are likely to be observed. For example, a PLD malfunction can result when the PLD is presented with stimuli that the designer did not expect, and therefore did not take into account during the design and simulation of the PLD. Such malfunctions are difficult to anticipate and must be debugged in the context of the complete system. Thus, simulation of an electronic design is useful, but usually cannot debug a PLD completely.

One approach to debugging a hardware device within a working system is to use a separate piece of hardware equipment called a logic analyzer to analyze signals present on the pins of a hardware device. Typically, a number of probe wires are connected manually from the logic analyzer to pins of interest on the hardware device in order to monitor signals on those pins. The logic analyzer captures and stores these signals for later viewing and debugging.

As an external logic analyzer may not always be optimal, embedding a logic analyzer within the hardware device is another technique used. For example, U.S. Pat. No. 6,182,247 entitled "Embedded Logic Analyzer for a Programmable Logic Device" discloses such a technique, and U.S. Pat. Nos. 6,286,114 and 6,247,147 disclose enhancements. In addition, viewing internal nodes in a device may be performed as disclosed in U.S. Pat. Ser. No. 6,754,862. Embedding a logic analyzer into a design is also a technique used in the product "ChipScope ILA" available from Xilinx Inc., of San Jose, California. The product "ChipScope Pro" also available from Xilinx uses logic cores built directly into a PLD to allow a user to access internal signals and nodes for debugging.

As useful as these techniques are in debugging a PLD, there is room for improvement. For example, as described in U.S. Pat. No. 6,286,114, a user controls a single embedded logic analyzer through a JTAG port. While such a technique is extremely useful, in many situations it would be desirable to have more than one internal debugging tool have access to the JTAG port, while still maintaining the benefits of a direct interface. In other words, it would be desirable for the user to be able to communicate with, and control, any number of internal logic analyzers, other debugging tools, or other applications through the JTAG port or a suitable serial interface.

For example, a PLD may use two different clock domains (or more) such as a 100 MHz and a 50 MHz clock. With two different clock speeds, a single embedded logic analyzer might not be able to capture debugging data from within the different clock domains. It would be useful to have two or more logic analyzers, each running at a different clock speed and still communicating to the user via a single, serial interface. The user may also wish to capture data from within different parts of the PLD using two or more different trigger conditions. Again, having more than one logic analyzer would be very useful.

The ChipScope product available from Xilinx, Inc. does provide the ability to have multiple logic analyzers within a PLD. It is believed, though, that these logic analyzers must be placed in series within the PLD which has disadvantages. For example, a user or software application desiring to access one of the logic analyzers using the ChipScope product needs to know about all of the internal logic analyzers and where the particular analyzer sits in the series chain. Requiring a user or software tool to be aware of all internal debugging tools and to coordinate amongst them can be confusing and inefficient.

It would be desirable to allow the user of an EDA tool to communicate with, and control, any number of embedded logic analyzers, debugging tools, or other internal applications that are within a PLD. Further, it would be desirable for the user to be able to control such a tool irrespective of any other internal tool, and to be able to do so via any single JTAG port or other serial interface.

SUMMARY OF THE INVENTION

To achieve the foregoing, and in accordance with the purpose of the present invention, a PLD debugging hub is disclosed that allows any number of client modules embedded within a PLD to communicate to an external computer using a serial interface.

The present invention allows user logic present within a PLD to be debugged by way of the hub. The PLD includes a serial interface that allows communication with a host computer. Within the PLD may be any number of client modules that provide instrumentation for the PLD. Each client module has connections with the user logic that allows the instrumentation to work with the user logic. The hub communicates with each client module over a hub/node signal interface, and communicates with the serial interface over a user signal interface. The hub may route instructions from the host computer to any client module via the serial interface.

In one sense, the hub disclosed functions as a multiplexor, allowing any number of client modules (or "nodes") to communicate externally though a serial interface of the PLD as if each node were the only node interacting with user logic. In this way, it is transparent that other nodes may also be present inside the PLD and control is simpler.

The hub described herein exists between a serial interface and user logic and provides a mechanism for sharing communication over a JTAG port (in one embodiment) amongst multiple, heterogeneous client modules. These client modules (such as logic analyzers, debugging tools or other) may operate independently and without knowledge of each of the other modules. These client modules include but are not limited to: a logic analyzer for capturing debugging data; a fault injector for forcing internal nodes to certain values for debugging; a debugging system controller used for controlling a debugging system within a microprocessor; and a signal source (also called a "programmable ROM") for use as "soft" constants in DSP or other applications that make use of fixed values. Other types of client modules are also possible.

Unlike prior art techniques that might use multiple internal logic analyzers in a series within a PLD, the present invention does not require a user or software tool to know about such other modules within the PLD. The existence of other modules is transparent when a user is communicating with a single module. Any EDA tool communicating with and controlling a particular module need not be aware of, and need not coordinate with, any other internal client module. The advantage is that control is simplified by providing and maintaining a uniform client module interface, while allowing the flexibility and scalability of adding other, possibly unrelated, client modules to the hub. This allows the EDA tool to be designed to interface to its client modules in such a way that the communication appears to be exclusive to a module, regardless of the actual configuration of the hub or of the presence of other modules.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
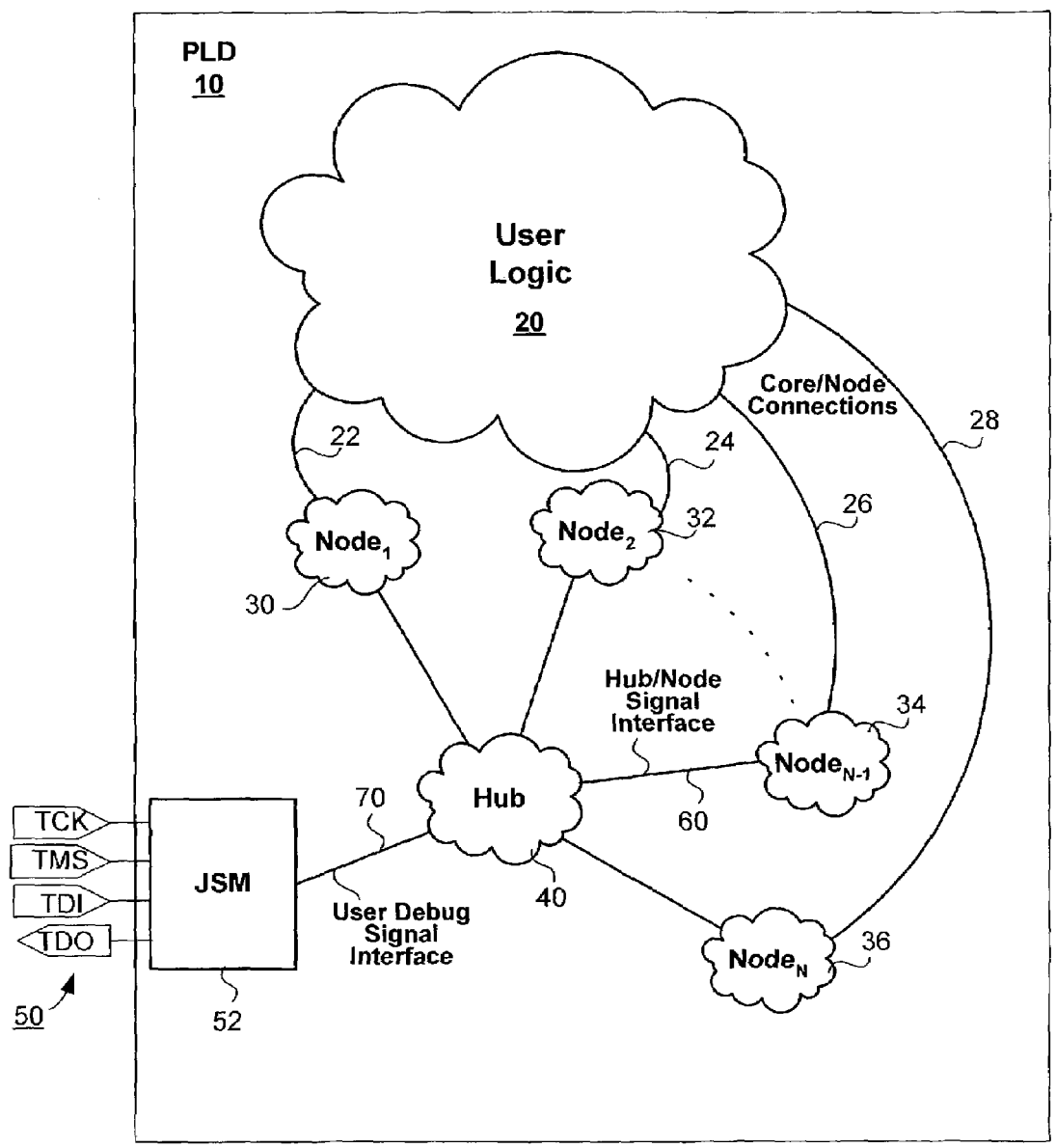
FIG. 1 is a block diagram of a programmable logic device (PLD) that embodies the present invention.
Figure 4:
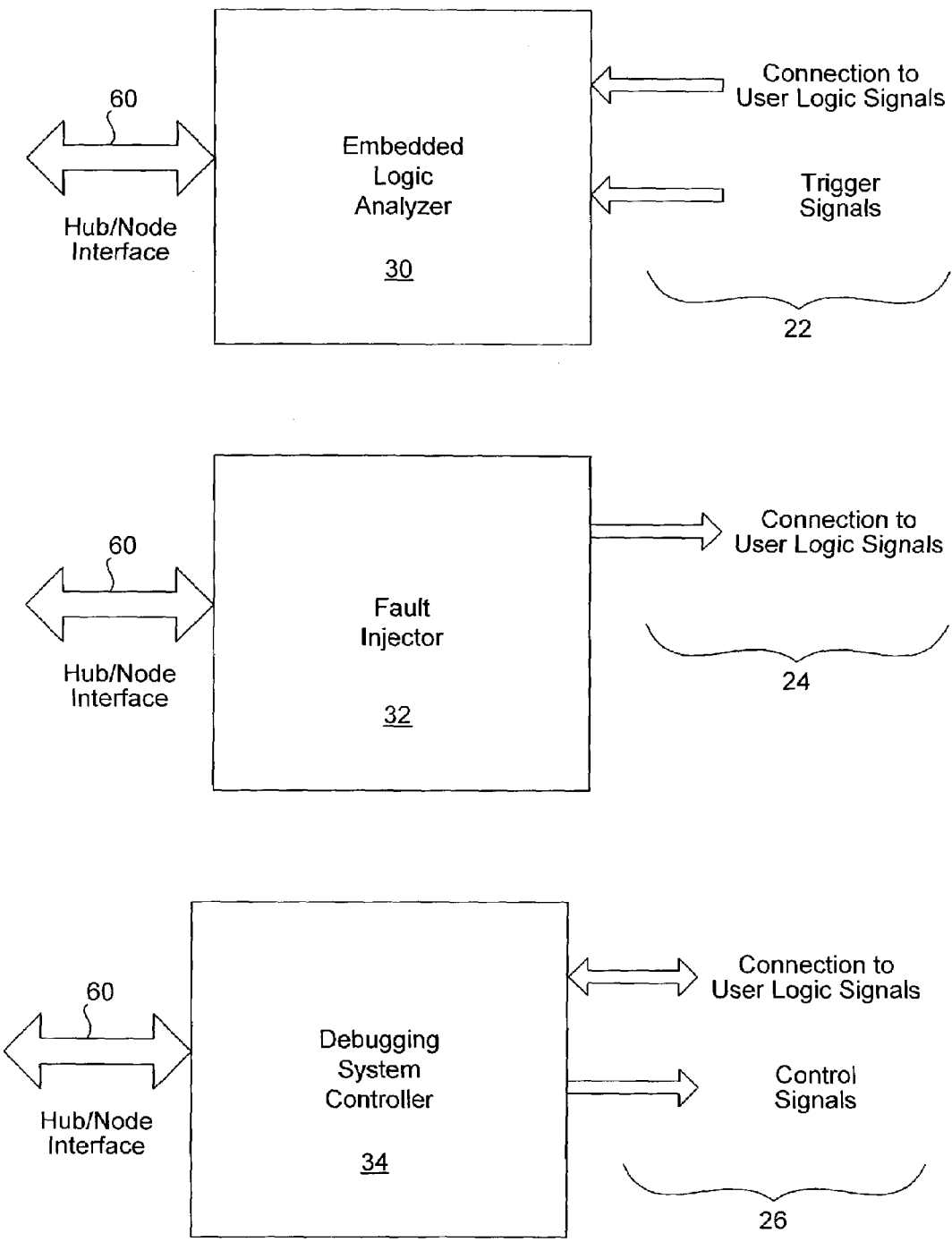
FIG. 4 illustrates examples of possible client modules.

FIG. 1 is a block diagram of a programmable logic device (PLD) 10 that embodies the present invention. Included are user logic 20, any number of client modules 30–36, a hub 40, interfaces 60 and 70, and a JTAG interface 50 and 52. User logic 20 is any electronic design created by a user that is programmed into a PLD; techniques for designing user logic and for programming a PLD are well known in the art. Client modules 30–36 (or "nodes") may be any module programmed into the PLD. In general, a module is a specific piece of instrumentation used to analyze, control or debug the user logic 20. As mentioned above, a module may be an embedded logic analyzer, a fault injector, a debugging system controller, a signal source, or other client instrumentation. FIG. 4 illustrates examples of possible client modules (or "nodes"). The core/node connections 22–28 are the responsibility of each module, i.e., the particular connections and how they are implemented will be specific to each module. Implementation of such connections is known in the art, and is also described in the above-referenced prior art in the Background.

PLD 10 highlights the interfaces between hub 40, the JTAG State Machine (JSM) 52, the nodes, the user logic 20, and the external JTAG signals 50 (TCK, TMS, TDI and TDO). The hub, nodes, user logic and their interconnections are preferably soft (i.e., realized in core logic). The four JTAG pins, their connection to the JSM, and JSM itself are preferably hard (i.e., dedicated hardware resources provided by the PLD). Alternatively, the hub and nodes may be a dedicated hardware resource of a PLD, in which case a particular PLD would be designed specifically to provide certain nodes. Or, the JSM may be implemented in core logic, providing more flexibility for the invention to be implemented on any PLD, and not necessarily on a PLD with a dedicated JSM.

The JTAG port includes JSM 52 and pins 50. A JTAG (Joint Test Action Group) port is implemented under the IEEE 1149.1 standard and is known to those of skill in the art. In this embodiment, the JTAG port includes signals TCLK, TMS, TDI and TDO. Signal TCLK is a clock signal that controls the rate of serial data in and out of the JTAG port. Signal TMS is a mode select signal used to direct traversal of the sixteen states of the JSM. Signals TDI and TDO are serial data in and serial data out, respectfully. JSM 52 is a standard part of the JTAG port and is preferably hard logic. It is also referred to as the test action port (TAP) controller.

Typically, a JTAG port is used either to program a PLD or to assist with testing a circuit board on which PLDs are located. Advantageously, it is realized that a JTAG port has traditionally been unused during the design and debugging of a particular PLD. Thus, it is further realized that a JTAG port on a PLD is under utilized and may be used during debugging of a PLD as a means of communicating with and controlling any number of internal client modules.

User Debug Signal Interface

The signal interface between JSM 52 and hub 40 is termed a user debug signal interface 70. In one embodiment, it is a hard interface that includes 7 signals. These 7 signals are listed below in Table 1. The hub signal port column shows the corresponding connection at hub 40.

The user debug signals are provided by the JSM and may be connected to core routing resources. The user debug signals are active when either the USER0 or USER1 JTAG instruction is the active instruction in the JSM. This condition is referred to as user debug mode (UDM). Unlike other JTAG instructions that use dedicated hardware resources to realize their target data registers, the target data register for these two instructions is realized in core logic. The user debug signals are used to control the communication to these registers.

The user debug signals are inactive when the instruction in the JSM is not USER0 or USER0 so that the content of their target data register is maintained while other operations are performed on the JTAG port.

TABLE 1

| JSM Signal Port | Hub Signal Port | Description |
| --- | --- | --- |
| CLOCK_U | → HUB_TCK | A gated TCK, active when the JSM is in states CDR or SDR |
| TDI_U | → HUB_TDI | Directly connected to TDI and always available |
| RUNIDLE_U | → HUB_RTI | Indicates that the JSM is in the RTI state |
| SHIFT_U* | → HUB_SHIFT | Indicates that the JSM is in the SDR state |
| UPDATE_U | → HUB_UPDATE | Indicates that the JSM is in the UDR state |
| USR1_U | → HUB_USR1 | Indicates that current instruction in the JSM is the USER1 instruction |
| TDO_U | ← HUB_TDO | Connected to TDO when in UDM and the JSM is in state SDR |

Figure 2:
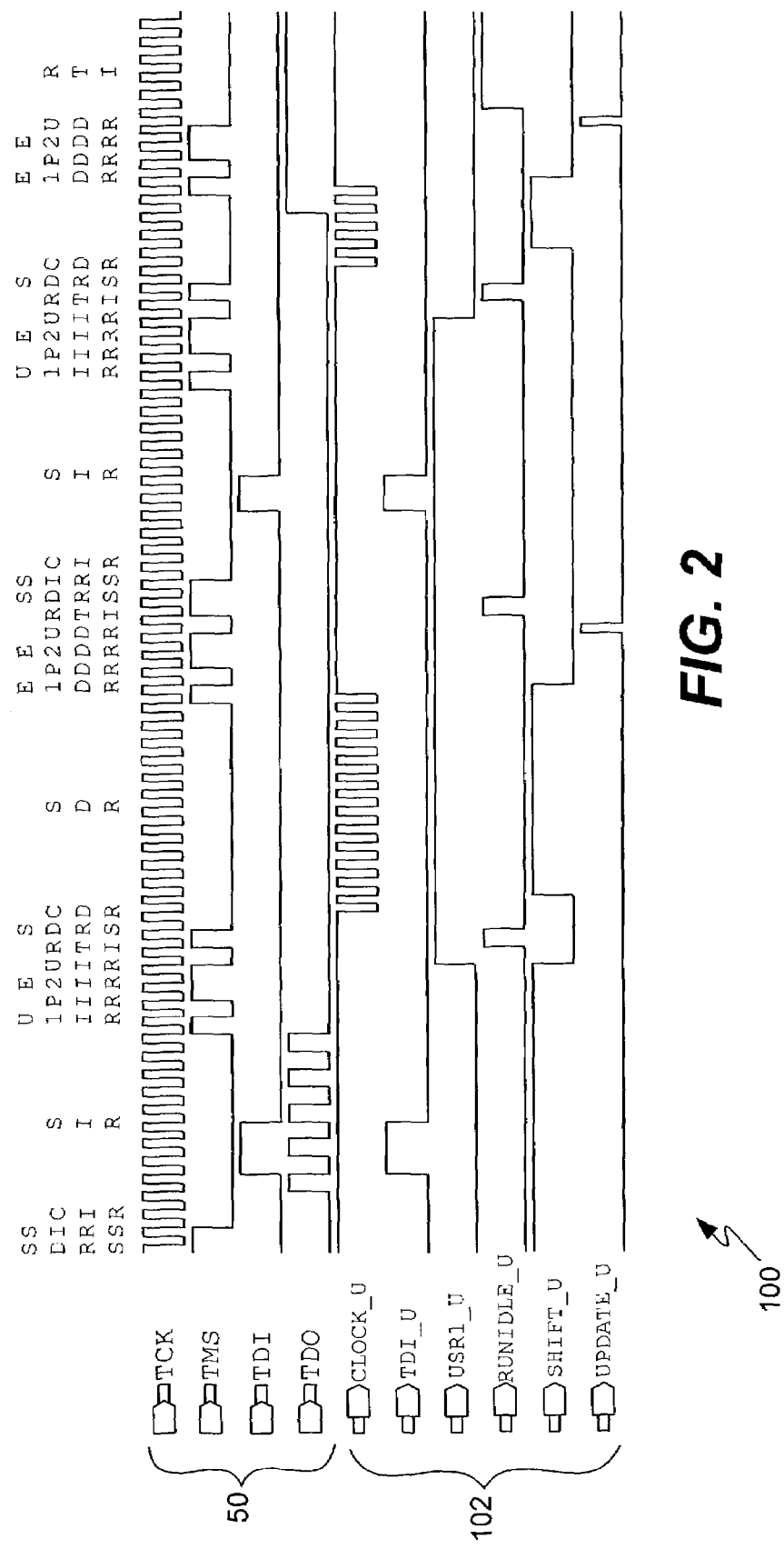
FIG. 2 illustrates the functional relationship between external JTAG signals and the user debug signal interface.

FIG. 2 illustrates the functional relationship 100 between external JTAG signals 50 and the user debug signal interface 70. Shown are signals 102 that are signals present on the JSM signal port as described in Table 1. In this example, PLD 10 has a hub with three nodes and a maximum node instruction length of 10. The first four timing signals in the FIG. are of JTAG signals 50, while the next six timing signals are those from the JSM signal port (with the exception of signal TDO_U which in an input to the port). FIG. 2 illustrates one example of how particular combinations of JTAG signals 50 are used to produce outputs over user debug signal interface 70. Of course, more signals may be added to the user debug signal interface, or there may be fewer. For instance, the TCK and TMS signals could be used, in addition to or in lieu of some signals in the user debug signal interface defined in Table 1, to provide more control and resolution into the current state of the JSM. Also, the signals may be encoded differently, outputs may be triggered on a falling edge instead of on a leading edge and vice-versa, etc.

Looking at FIG. 2 from left to right, the JSM moves from RTI (not shown) to SIR, where the USER1 instruction (0000001110) is shifted in (LSB to MSB). Upon the falling edge of TCK when the JSM is in UIR, the USR1_U signal goes high, indicating the USER1 instruction is now the active instruction in the JSM (i.e., the JSM is in user debug mode). Consequently, SHIFT_U goes low. Next, the JSM moves to SDR, where 12 bits of zero are shifted in. Since USER1 is the active instruction in the JSM, this corresponds to an instruction load for hub 40 with the HUB_INFO instruction (irsr[11 . . . 10]='00' and irsr[2 . . . 0]='000'). The JSM then moves to SIR, where the USER0 instruction (0000001100) is shifted in, and then to SDR, where the first 4 bits held in hub 40 Info Store 632 are shifted out.

Alternative Serial Interface

Figure 3:
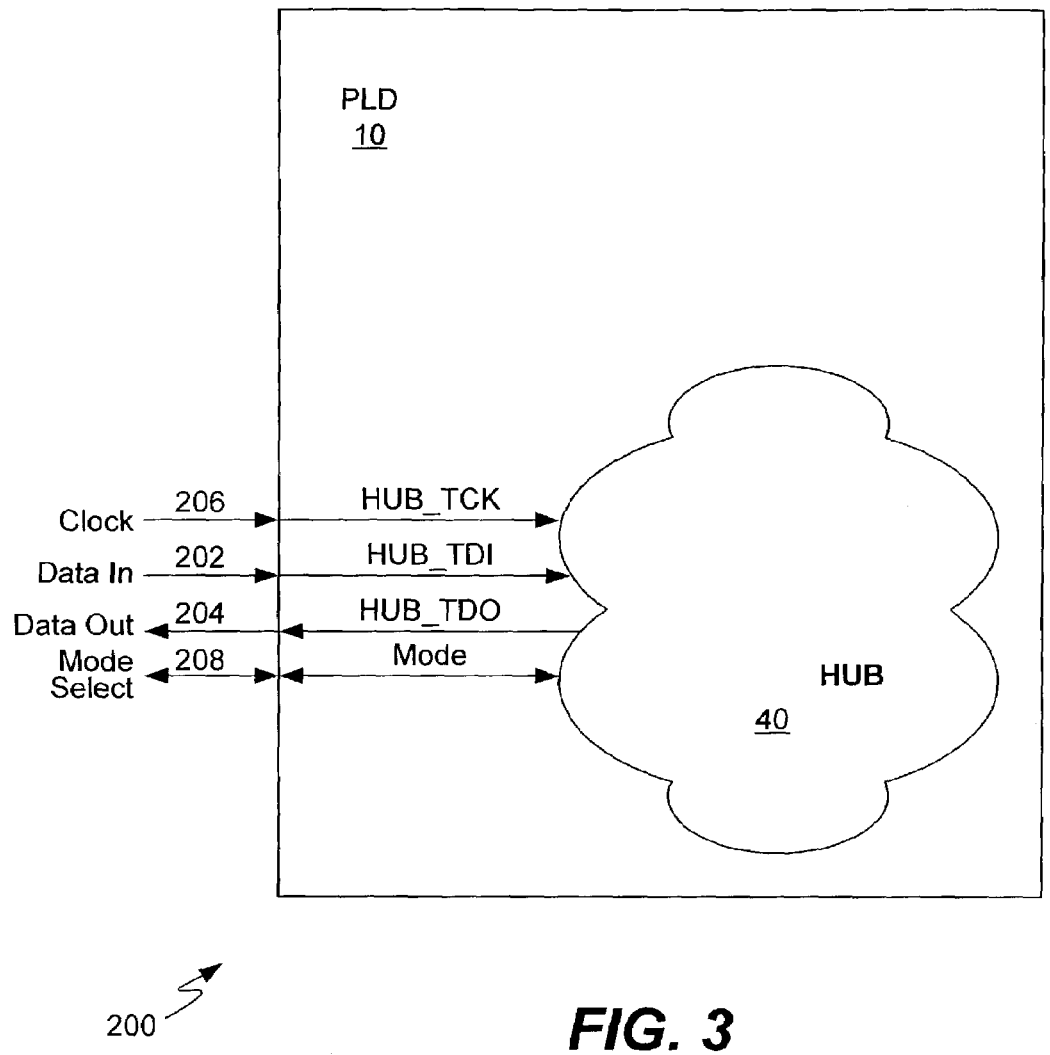
FIG. 3 illustrates an alternative embodiment in which the hub communicates outside the PLD using a serial interface.

FIG. 3 illustrates an alternative embodiment 200 in which hub 40 communicates outside the PLD 10 using a serial interface. The serial interface shown is by way of example, and other types of serial interfaces may be used. In this example, communication takes place over four pins of the PLD; of course, any number of pins may be used to perform a similar function. Pins 202 and 204 transmit respectively a data in signal and a data out signal to and from the PLD. Pin 206 is a clock signal provided by the external computer which is used to synchronize the serial transmission of commands, data and other information from the external computer to the PLD, and from the PLD to the external computer.

Mode select pin 208 is used to transmit commands, modes and other control information from the external computer to hub 40. Mode select 208 may use more than one pin and may also be used to receive status or other information from the hub. Mode select may also transmit identifying information for a particular client module from the external computer to the PLD. Pin 208 may be connected to a separate mode input of hub 40 or to any of the signals listed in Table 1 as appropriate. In this fashion, the hub communicates with an external computer using a serial interface that is not necessarily a JTAG port.

Hub/Node Signal Interface

The signal interface between hub 40 and any node 30–36 is termed the hub/node signal interface. This is preferably a soft interface that includes 5 buses and 7 signals. The hub/node signals are connected using core routing resources. Such connections may easily be made by one of skill in the art. Table 2 below shows the hub/node signal interface with respect to a particular node. In other words, although hub 40 may be connected to any number of nodes, the second column of Table 2 shows only those connections on a single node. Should there be more than one node, each node would have the connections shown in the second column. In an embodiment where Hub/Node connections are made automatically by a netlist builder tool (e.g., an EDA tool), it is preferable that that connected nodes use the bus/signal name definitions shown in Table 2. By way of example, such a tool may be the "Quartus" product available from Altera Corporation, or other netlist builder tool.

TABLE 2

| Hub Bus/Signal Port | Node i Bus/Signal Port | Description |
|---|---|---|
| NODE_TCK | → TCK | Node clock (common to all nodes) |
| NODE_TDI | → TDI | Node data in (common to all nodes) |
| NODE_RTI | → RTI | Indicates that the JSM is in the RTI state (common to all nodes) |
| NODE_SHIFT | → SHIFT | Indicates that the JSM is in the SDR state (common to all nodes) |
| NODE_UPDATE | → UPDATE | Indicates that the JSM is in the UDR state (common to all nodes) |
| NODE_USR1 | → USR1 | Indicates that current instruction in the JSM is the USER1 instruction (common to all nodes) |
| NODE_CLRN | → CLRN | Asynchronous clear (common to all nodes) |
| NODE_ENA[i] | → ENA | Indicates that the current instruction in hub 40 is for node i |
| NODE_IR_OUT[i][N_NODE_IR_BITS(i)-1..0] | → IR_IN[N_NODE_IR_BITS(i)-1..0] | Node i IR |
| NODE_TDO[i] | ← TDO | Node i data out |
| NODE_IRQ[i] | ← IRQ | Node i interrupt |
| NODE_IR_IN[i][N_NODE_IR_BITS(i)-1..0] | ← IR_OUT[N_NODE_IR_BITS(i)-1..0] | Node i IR capture port |

Details on the connections shown in Table 2 are as follows. The variable N_NODE_IR_BITS(i) is the number of instruction register bits required by a node i. The signals NODE_TCK, NODE_TDI, NODE_RTI, NODE_SHIFT, NODE_UPDATE and NODE_USR1 of the hub port for the nodes are directly connected to the signals HUB_TCK, HUB_TDI, HUB_RTI, HUB_SHIFT, HUB_UPDATE and HUB_USR1 of the hub port for the JSM, respectively.

The NODE_CLRN signal is an asynchronous, active low clear signal that is activated when the JSM is in RTI after the HUB_RESET instruction becomes the active Hub instruction. Since hub 40 is also reset by this signal, the HUB_INFO instruction becomes the active Hub instruction.

The NODE_ENA[i] bus is a one-hot bus that is used to inform a node that the current hub instruction is for that node, e.g. if $NODE_{13}$ ENA[3] is 1, then an instruction for node 3 is the current instruction in the hub's instruction register. This means that when NODE_SHIFT is 1, the associated target register for their instruction is part of the JTAG TDI→TDO scan chain. Moreover, this places the burden on nodes to provide a path between TDI and TDO. Preferably, there is no discontinuity between TDI and TDO when NODE_SHIFT is 1. For the HUB_INFO instruction, a 4-bit shift register is used between TDI and TDO. For other hub instruction patterns, hub bypass register 634 is between TDI and TDO.

Hub 40 provides the instruction register resource for all nodes, and nodes obtain their instruction from their respective NODE_IR_OUT[i] port of the Hub. Hub 40 stores the instruction for each node in instruction register file 630. Node TDOs are fed to their corresponding NODE_TDO[i] input port of the Hub.

The NODE_IRQ[i] port is provided so that nodes may indicate that they need attention, i.e., a node has a result or stored information that should be communicated externally back to the user or EDA tool. For example, a node that is a logic analyzer may have captured data that needs to be sent back to a host computer to aid in debugging the PLD. In one embodiment, this interrupt feature is implemented as follows. All of the NODE_IRQ[i] inputs are OR'ed together, and made available on the MSB of USER1 data register scans (i.e., UDM instruction loads).

This single bit interrupt flag indicates the existence of a service request on one or more Nodes. Due to the nature of the shared JTAG user debugging access that hub 40 provides, a node should keep its IRQ signal high until the node is serviced. The host agent (such as an EDA tool running on a host computer) controlling the communication with the nodes polls each node it controls to see which (if any) nodes need to be serviced. All nodes share the same interrupt level, so the host agent should establish a pecking order if multiple nodes need to be serviced simultaneously. Alternatively, a rigid interrupt level may be established in which nodes are serviced in a particular order. When the host agent decides to service a particular node, the host agent executes the node's interrupt service routine. This series of operations is specific to a node, and is executed by issuing instructions and/or performing data exchange operations on the node. Once this routine is complete, it is either up to the host agent to direct the node to clear its IRQ signal, or the node's logic to automatically acknowledge that its interrupt has been serviced and clear the IRQ signal without further intervention from the host agent.

One method of communication from a node to the outside world that avoids the overhead of accessing the target data register of the node's instruction utilizes the NODE_IR_IN[i] bus and the hub's instruction register (IR) capture value. A given node i can use the NODE_IR_IN[i] bus of hub 40 to provide the IR capture value during UDM instruction loads when the current hub instruction is for node i. In this way, information may be transferred without accessing the target data register of the instruction currently being applied in the UDM instruction load sequence. It also allows for node i with an instruction that targets a read-only data register to save PLD resources and use a single register as the instruction's target data register, while providing the read-only information in the IR capture value assuming that the read-only data length is of equal or lesser value than the IR length of node i. The HUB_FORCE_IR_CAPTURE instruction may be used to force the IR capture value to be from a node other than the one targeted by the current hub instruction. This feature is very useful in that it may not be known which instruction currently resides in the hub (i.e., it may not be possible to ensure that an instruction for a particular node was the last one issued), and the IR capture value for a particular node is required. Issuing HUB_FORCE_IR_CAPTURE prior to the issuance of an instruction for node i will guarantee that the IR capture value is from node i. The IR capture value is undefined when hub 40 is in broadcast mode.

Examplary Flow Diagrams

Figure 5:
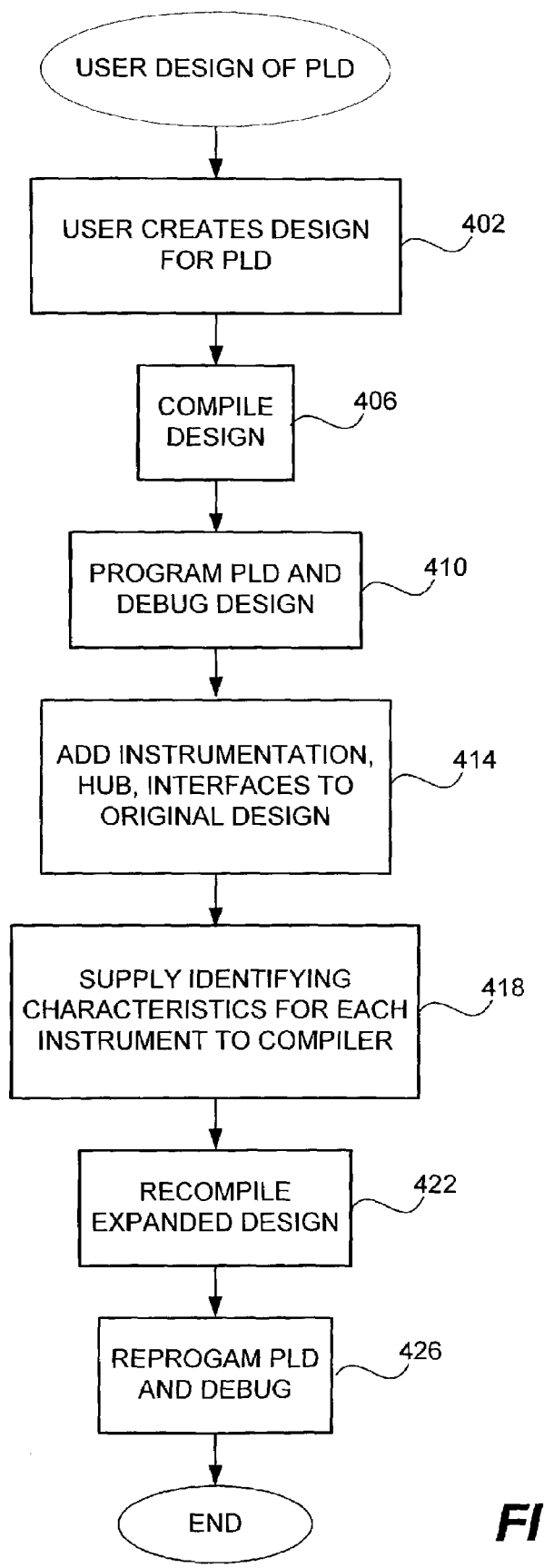
FIG. 5 is a flow diagram illustrating one embodiment in which a PLD is programmed for debugging.

FIG. 5 is a flow diagram illustrating one embodiment in which a PLD is debugged. Of course, other similar design methodologies may be used, including those referenced in the Background section. A user first develops a design for a PLD using an EDA tool and then compiles the design. The design is then programmed into a PLD (such as PLD 10 with the capability to implement the present invention. The user then debugs the PLD, and, assuming that bugs are found in the design, proceeds as follows.

The user returns to the design and instructs the EDA tool to add a hub 40 and signal interfaces as described herein. The user then instructs the EDA tool to add the instrumentation needed (e.g., logic analyzers, fault injectors, etc.). Alternatively, the PLD may have been preprogrammed for this eventuality and already includes this logic. The commands may be given via a graphical user interface (GUI), by directly adding the required functionality to the design, or in other similar ways. Advantageously, any number and type of instrumentation may be added, constrained only by the size of the PLD. Techniques for adding a particular instrumentation will vary by the type, and are known to those of skill in the art. For each instrumentation, the user supplies a manufacturer identifier, a node identifier, a node version number, and a node instance number.

The user next performs a recompile to include all of the added instrumentation, hub, signal interfaces, etc. During the recompile, the EDA tool (or compiler) assigns each node a selection identifier to aid in sending instructions and data to a node, as well as to aid in receiving information from a node. The selection identifier is a unique identifier for a particular node in the PLD, and is preferably derived from a combination of the identifiers listed above, although the selection identifier may be derived from other information as well. The new design is then programmed onto a PLD and the user may debug once again using any of the instrumentation added.

Figure 6:
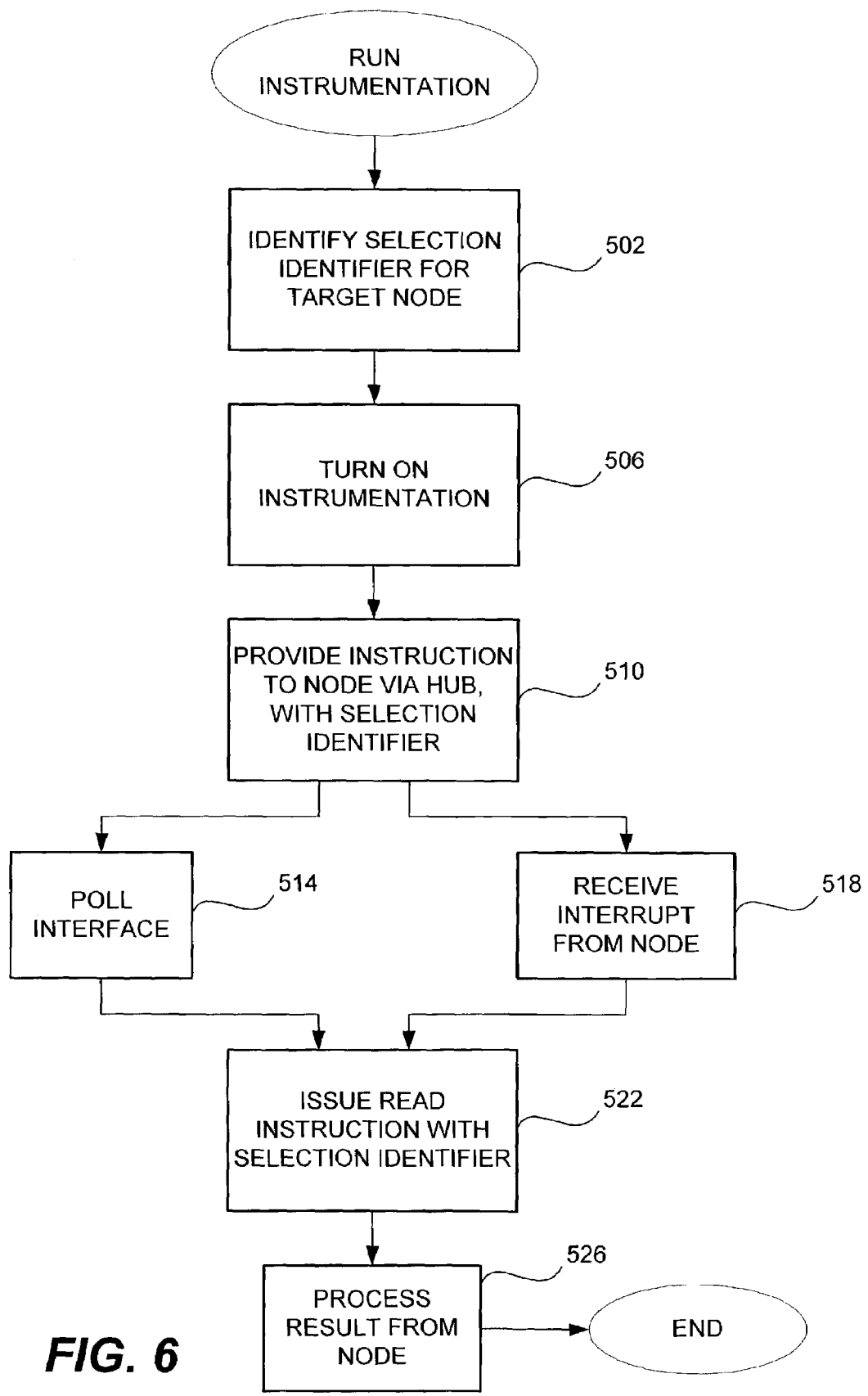
FIG. 6 is a flow diagram illustrating one embodiment in which a PLD is debugged.

FIG. 6 is a flow diagram illustrating one embodiment in which a PLD is debugged. Once the instrumentation and hub have been added (for example, as shown in FIG. 5), the user is ready to begin using the instrumentation. To identify each node, and to keep operation of other nodes transparent for a chosen node, the EDA tool and hub use the selection identifier to direct instructions to a node and to poll a node for information. Preferably, the selection identifier precedes an instruction for a node, although this could be reversed. In a first step, an instruction is issued from the EDA tool to arm, enable, or otherwise turn on the embedded instrumentation. Each may be turned on separately, or all may be turned on together.

To provide an instruction to a node (e.g., run, stop, trigger condition, control command, etc.), the EDA tool provides the instruction to the hub via the JTAG interface preceded by the node's selection identifier. To receive information from a node, polling or interrupts may be used. Typically, the outside host agent (EDA tool or other software) periodically polls the JTAG interface for a signal that the node is ready with information. Alternatively, a node may send back an interrupt in an instruction scan. The interrupt may be a set flag, a particular instruction, etc. Once the host agent has detected that a node is ready with information (by polling, interrupt, etc.), the host issues a read instruction preceded by the node's selection identifier in order to receive the information, or take other appropriate action.

Hub Implementation Example

Figure 7:
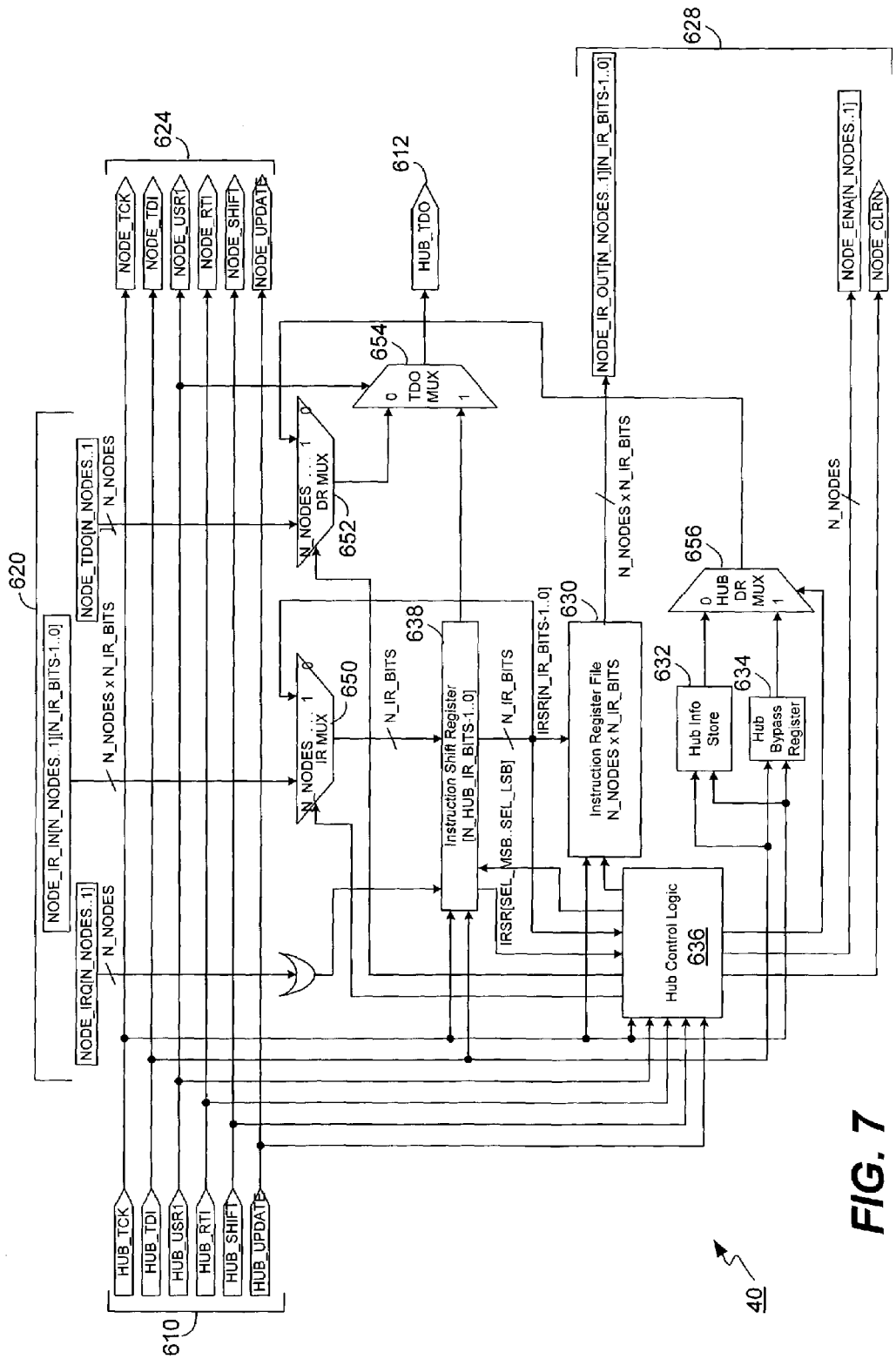
FIG. 7 is a block diagram of one embodiment of the hub.

FIG. 7 is a block diagram of one embodiment of hub 40. Hub 40 serves to allow communication between any number of nodes 30–36 and a JTAG port (or any other suitable serial interface) so that a node may interact with user logic 20 as a user desires. Typically, a node may be a logic analyzer and hub 40 facilitates control of that logic analyzer, for example. As previously described, signals 610 are received as input from JSM 52, and signal 612 is output to the JSM. Buses 620 are input from any number of nodes, and signals and buses 624 and 628 are output to any nodes that are present.

The data registers associated with the JTAG USER0 and USER1 instructions are user-defined. To provide instructions and information to the hub or to a node, the operation of the hub mimics the instruction/data register (IR/DR) paradigm defined by the JTAG standard. This operation is accomplished by designating the user-defined DR for the USER1 instruction as the hub's instruction register, or instruction shift register (IRSR). Correspondingly, the USER0 instruction targets the hub's data register. All nodes also follow this paradigm. Therefore, to issue an instruction to either hub 40 or a Node, the USER1 instruction is the active instruction in the JSM, and the instruction is shifted in when the JSM is in the SDR state. Similarly, to shift in associated target register data, the USER0 instruction is the active instruction in the JSM, and the associated target register data is shifted in when the JSM is in the SDR state.

Hub 40 includes an instruction register file 630, a hub information store 632, a hub bypass register 634, hub control logic 636, and an instruction shift register 638. Also included are multiplexors 650–656. As will be appreciated by one of skill in the art, hub 40 may implemented in other ways, yet still provide the same functionality.

Instruction register file (IRF) 630 consists of the instruction registers for all nodes. In other words, IRF 630 stores instructions for all nodes in hub 40 before the instruction is sent out to each node. Advantageously, each node need not store any instructions, and need not look at all instructions provided to hub 40, thus providing greater efficiency. Instruction shift register (IRSR) 638 receives instruction information from the JSM via HUB_TDI serially and transfers it into the proper destination in the IRF 630 as directed by the hub control logic (HCL) 636. In addition, IRSR 638 receives information from a node (i.e., the IR capture value) and transfers it serially back to the JSM via HUB_TDO 612.

Hub information store 632 is a repository of hub configuration and node identification information. For example, store 632 keeps a record of: a manufacturer identifier, indicating from which manufacturer a node originates; a node identifier, indicating the type of instrumentation that the node embodies; a node version number, indicating the version of that particular type of instrumentation; and a node instance number, which uniquely identifies a node. Further details are provided below in Table 6 as an example of the type of information that is stored to ensure proper operation. Preferably, this information is compiled into the hub when first compiled. Other information may be included in store 632 as deemed necessary. For instance, PLD resource usage information for nodes may be kept in store 632, or other important information necessary for proper use and control of a node.

Hub bypass register 634 is used to maintain JTAG continuity when there is no target register for the hub, or if a targeted node is outside the valid node selection space. Register 634 provides a default path for any instruction without a valid target register, or an invalid data register. Hub control logic (HCL) 636 generates the necessary control signals used throughout the Hub. The User Debug Signal Interface and the value in instruction shift register 638 (ISR) provide the input stimulus to the HCL. The outputs from the HCL control the multiplexors used to steer data to its proper destination, and serve as register enable controls. HCL 636 also has the function of maintaining JTAG continuity if an "out-of-bounds" instruction is issued, e.g., if an instruction targets a node outside the valid node selection space the HCL will maintain JTAG continuity by placing hub bypass register between HUB_TDI and HUB_TDO. Alternatively, HCL may be implemented as two logical boxes instead of the single one shown. For example, the HCL may be broken into those signals and logic that control the hub, and those that are used for controlling output.

The following parameters are used to specify the hub, and are provided by the netlist builder tool.

TABLE 3

| Parameter | Definition |
| --- | --- |
| N_NODES | The number of nodes connected to the hub |
| N_IR_BITS | MAX(N_NODE_IR_BITS(i)) |
| NODE_INFO(i) | A 32-bit value (described below) |

The hub also makes use of the following constant definitions.

TABLE 4

| Constant | Definition |
| --- | --- |
| N_SEL_BITS | CEIL(LOG2(N_NODES + 1)) |
| N_HUB_IR_BITS | N_SEL_BITS + N_IR_BITS |
| SEL_MSB | N_HUB_IR_BITS − 1 |
| SEL_LSB | N_IR_BITS |

The length of the hub's instruction register (IRSR) is 'N_HUB_IR_BITS' bits, which is the sum of N_IR_BITS (i.e., MAX(N_NODE_IR_BITS(i)), the maximum of the node and the minimum hub IR lengths) and N_SEL_BITS (i.e., the number of bits required to encode the number of nodes plus the hub). This encoded value (SELect) allows for the hub and all nodes to have non-conflicting instruction codes. By definition, the minimum hub IR length N_NODE_IR_BITS(Hub)=N_SEL_BITS+3, SEL(Hub)=0 always, and SEL(Node(i))=i. Table 5 below shows the instructions supported by the hub.

TABLE 5

| Instruction | Value | Description |
| --- | --- | --- |
| HUB_INFO | 0 | Provides information about the hub and all of the nodes |
| HUB_START_BROADCAST | 1 | Delays instruction updates to nodes until HUB_END_BROADCAST is issued |
| HUB_END_BROADCAST | 2 | Updates node instructions |
| HUB_FORCE_IR_CAPTURE | 3 | Forces the instruction capture of the next instruction load to come from the specified node |
| HUB_RESET | 7 | Asserts NODE_CLRN while JSM is in RTI |

When the HUB_INFO instruction is issued, the data in hub information store 632 is shifted out 4 bits at a time, i.e., multiple cycles through the data register (DR) leg of the JSM are required to retrieve all the data. Each nibble is loaded on the rising edge of HUB_TCK when the JSM is in the CDR state. The information held in hub information store 632 is packed into lookup table (LUT) CRAM cells to reduce resource usage. The data is shifted out LSB to MSB as shown in Table 6.

TABLE 6

| DWORD\BIT | 31 | 27 | 26 19 | 18 8 | 7 | 0 |
| --- | --- | --- | --- | --- | --- | --- |
| 0 | | HUB_VERSION | N_NODES | MFG_ID | | N_IR_BITS |
| 1 | | NODE$_1$ VERSION | NODE$_1$ ID | NODE$_1$ MFG_ID | | NODE$_1$ INSTANCE |
| | | . | . | . | | . |
| | | . | . | . | | . |
| | | . | . | . | | . |
| N | | NODE$_N$ VERSION | NODE$_N$ ID | NODE$_N$ MFG_ID | | NODE$_N$ INSTANCE |

HUB_VERSION and MFG_ID are embedded in the source logic of the hub. MFG_ID is a manufacturer's identification number assigned by an entity authorized to maintain unique identifiers for this invention. N_NODES is a parameter provided by the netlist builder tool, and N_HUB_IR_BITS is a constant computed as defined above. The NODE_INFO(i) parameters are concatenated by the netlist builder tool and are passed on as one long parameter to the hub. NODE ID, assigned by the manufacturer of the client module, identifies the type of client module functionality. For example, a NODE ID of 0 could represent a logic analyzer, a NODE ID of 1 could represent a fault injector, etc. NODE VERSION, also assigned by the manufacturer of the client module, represents the version of this particular type of client module. NODE INSTANCE, assigned by an FDA tool inserting the hub and client modules into the PLD design, identifies the instance of a particular NODE ID in the PLD. For example, if there are two logic analyzers in the same PLD from the same manufacturer and each is the same version, NODE INSTANCE distinguishes between the two.

The HUB_START_BROADCAST instruction is used to delay instruction updates to Nodes. This provides the ability to issue instructions simultaneously to the all of the Nodes.

An application of this feature would be to simultaneously arm multiple logic analyzers within the PLD. The HUB_END_BROADCAST instruction updates all NODE_IR_OUT[i] buses.

For nodes that use the instruction register (IR) capture value, the last instruction issued may have been for a different node, and the instruction register capture value will be for that other Node. The HUB_FORCE_IR_CAPTURE instruction can be used to force the IR capture from a particular Node. The format of this instruction for node i is shown below.

TABLE 7

| N_HUB_IR_BITS-1 ... N_SEL_BITS+3 | N_SEL_BITS+2 | 3 | 2 | 0 |
|---|---|---|---|---|
| 0 | i | 0 | 1 | 1 |

Programmable Logic Development System

In the course of developing an electronic design for programming a programmable logic device (PLD), a programmable logic development system is used. As used herein, "electronic design" refers to a design used to program circuit boards and systems including multiple electronic devices and multi-chip modules, as well as integrated circuits. For convenience, the present discussion generally refers to "integrated circuits", or to "PLDs", although the invention is not so limited.

Figure 8:
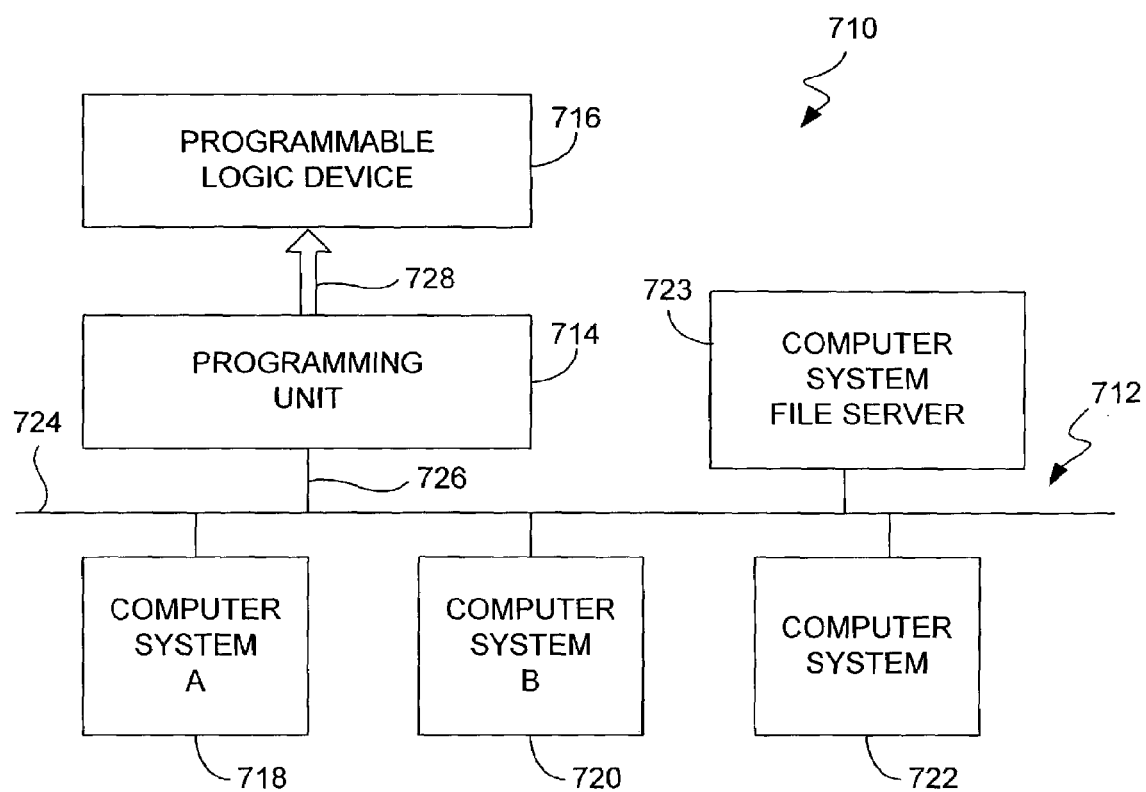
FIG. 8 is a block diagram of an embodiment of a programmable logic development system.

FIG. 8 is a block diagram of an embodiment of a programmable logic development system 710 that includes a computer network 712, a programming unit 714 and a programmable logic device 716 that is to be programmed. Computer network 712 includes any number of computers connected in a network such as computer system A 718, computer system B 720, computer system C 722 and computer system file server 723 all connected together through a network connection 724. Computer network 712 is connected via a cable 726 to programming unit 714, which in turn is connected via a programming cable 728 to the PLD 716. Alternatively, only one computer system could be directly connected to programming unit 714. Furthermore, computer network 712 need not be connected to programming unit 714 at all times, such as when a design is being developed, but could be connected only when PLD 716 is to be programmed.

Programming unit 714 may be any suitable hardware programming unit that accepts program instructions from computer network 712 in order to program PLD 16. By way of example, programming unit 714 may include an add-on logic programmer card for a computer, and a master programming unit, such as are available from Altera Corporation of San Jose, California. PLD 716 may be present in a system or in a programming station. In operation, any number of engineers use computer network 712 in order to develop programming instructions using an electronic design automation software tool. Once a design has been developed and entered by the engineers, the design is compiled and verified before being downloaded to the programming unit. The programming unit 714 is then able to use the downloaded design in order to program PLD 716.

For the purposes of debugging a PLD according to an embodiment of the present invention, any of the computers shown or others may be used by an engineer to compile a design. Furthermore, programming cable 728 may be used to receive data from the PLD, or a separate debugging cable may be used to directly connect a computer with device 716. Such a programmable logic development system is used to create an electronic design. A user creates a design by specifying and implementing functional blocks.

The above-referenced U.S. patents disclose a design methodology for using a system design specification in order to develop a design with which to program a PLD. It should be appreciated that the present invention may be practiced in the context of a wide variety of design methodologies, and with diverse electronic design automation (EDA) software tools.

Computer System Embodiment

Figure 9A:
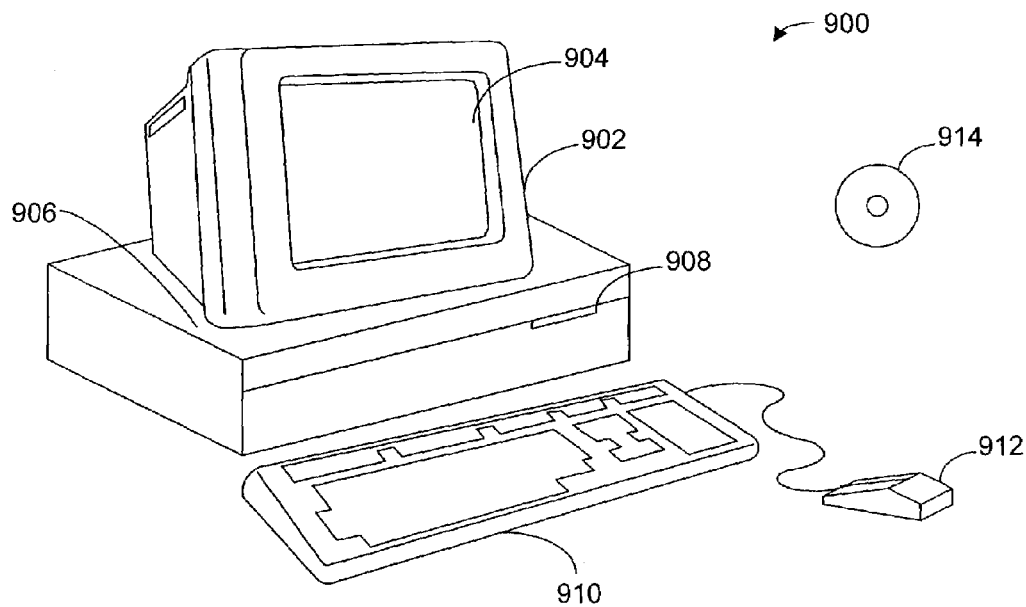
FIGS. 9A and 9B illustrate a computer system suitable for implementing embodiments of the present invention.
Figure 9B:
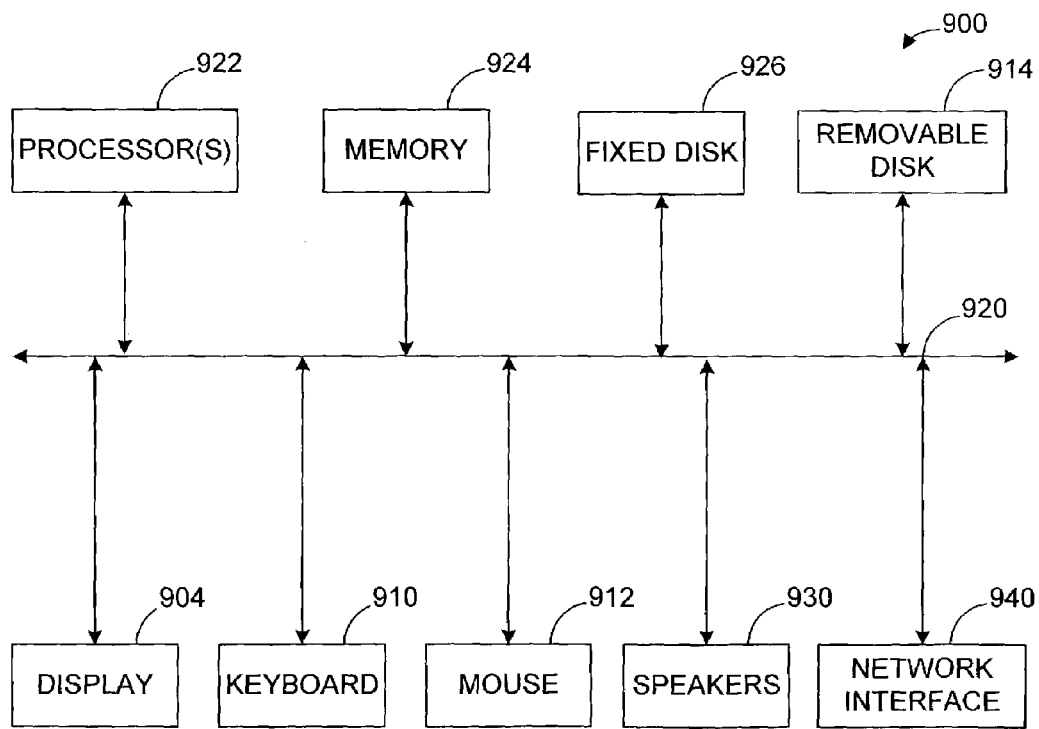

FIGS. 9A and 9B illustrate a computer system 900 suitable for implementing embodiments of the present invention. FIG. 9A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 9B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A programmable logic device (PLD) arranged to provide instrumentation for user logic, said PLD comprising:
   user logic arranged to perform a function designated by a user;
   a serial interface in communication with a host computer;
   a client module in communication with said user logic that provides instrumentation regarding said user logic; and
   a hub in communication with said client module and with said serial interface, said hub being arranged to route instructions from said host computer to said client module via said serial interface, whereby said client module provides said instrumentation for said user logic of said PLD.

2. A PLD as recited in claim 1 wherein said client module is a logic analyzer, a fault injector, a debugging system controller or a signal source.

3. A PLD as recited in claim 2, said hub being further arranged to route information from said client module to said host computer via said serial interface.

4. A PLD as recited in claim 1 further comprising:
   a user signal interface that provides said communication between said hub and said serial interface; and
   a hub/node interface that provides said communication between said hub and said client module.

5. A PLD as recited in claim 4 wherein said serial interface is a JTAG port.

6. A PLD as recited in claim 1 wherein said serial interface is a JTAG port.

7. A PLD as recited in claim 1 further comprising:
   a plurality of client modules, each in communication with said user logic and each providing instrumentation regarding said user logic,
   wherein said hub is in communication with each of said client modules, said hub being arranged to route instructions from said host computer to one of said client modules via said serial interface, whereby said one client module provides instrumentation for said user logic of said PLD.

8. A PLD as recited in claim 7 further comprising:
   an instruction register of said hub that stores instructions for each of said client modules, whereby use of said instrumentation for one of said client modules is transparent to the other client modules.

9. A system arranged to debug user logic in a programmable logic device (PLD), said system comprising:
   a host computer;
   a serial interface;
   a PLD in communication with said host computer over said serial interface, said PLD including,
   user logic,
   a plurality of client modules, each in communication with said user logic, and
   a hub in communication with each client module and with said serial interface, said hub being arranged to route instructions from said host computer to said client modules via said serial interface; and
   an EDA software tool of said host computer that is arranged to send instructions to said client modules of said PLD using said serial interface and via said hub, whereby said client modules debug said user logic of said PLD.

10. A system as recited in claim 9 wherein one of said client modules is a logic analyzer, a fault injector, a debugging system controller or a signal source.

11. A system as recited in claim 10, said hub being further arranged to route information from one of said client modules to said host computer via said serial interface.

12. A system as recited in claim 9 wherein said serial interface is a JTAG port.

13. A system as recited in claim 9, said hub being further arranged to route information from one of said client modules to said host computer via said serial interface, whereby said one client module debugs said user logic of said PLD.

14. A system as recited in claim 9 further comprising:
   an instruction register of said hub that stores instructions for each of said client modules, whereby use of an instrumentation for one of said client modules is transparent to the other client modules.

15. A hub of a programmable logic device (PLD) arranged to assist with instrumentation of said PLD, said hub comprising:

control logic;
a hub interface from said hub to each of a plurality of client modules, each of said client modules providing instrumentation for said PLD;
a user interface from said hub to a serial interface of said PLD;
an instruction register that stores instructions for each of said client modules;
logic gates arranged to route an instruction of said instruction register to one of said client modules based on a selection identifier; and
logic gates arranged to receive data from one of said client modules and to store said data in said instruction register, whereby said hub assists with instrumentation of said PLD by communicating with said client modules.

16. A hub as recited in claim 15, said hub being further arranged to route data from said client module to a host computer via said serial interface.

17. A hub as recited in claim 15 wherein said serial interface is a JTAG port.

18. A computer-readable medium for providing instrumentation for user logic of a programmable logic device (PLD), computer code of said computer-readable medium comprising electronic representations of:
user logic of said PLD;
a serial interface arranged to link a host computer with said PLD;
a client module in communication with said user logic that provides instrumentation regarding said user logic; and
a hub in communication with said client module and with said serial interface, said hub being arranged to route instructions from said host computer to said client module via said serial interface, whereby said client module provides said instrumentation for said user logic of said PLD.

19. A computer-readable medium as recited in claim 18 wherein said client module is a logic analyzer, a fault injector, a debugging system controller or a signal source.

20. A computer-readable medium as recited in claim 19, said hub being further arranged to route information from said client module to said host computer via said serial interface.

21. A computer-readable medium as recited in claim 18 wherein said serial interface is a JTAG port.

22. A computer-readable medium as recited in claim 18 further comprising electronic representations of:
a plurality of client modules, each in communication with said user logic and each providing instrumentation regarding said user logic,
wherein said hub is in communication with each of said client modules, said hub being arranged to route instructions from said host computer to one of said client modules via said serial interface, whereby said one client module provides instrumentation for said user logic of said PLD.

23. A computer-readable medium as recited in claim 18 wherein said medium is associated with an EDA software tool.

* * * * *